(12) United States Patent
Kim

(10) Patent No.: US 8,426,314 B2
(45) Date of Patent: Apr. 23, 2013

(54) METHOD FOR FORMING SEMICONDUCTOR DEVICE

(75) Inventor: Kyung Ae Kim, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 90 days.

(21) Appl. No.: 13/191,525

(22) Filed: Jul. 27, 2011

(65) Prior Publication Data

US 2012/0108070 A1 May 3, 2012

(30) Foreign Application Priority Data

Oct. 27, 2010 (KR) .................. 10-2010-0105352

(51) Int. Cl.
*H01L 21/311* (2006.01)

(52) U.S. Cl.
USPC ............ 438/703; 438/702; 438/700; 438/701

(58) Field of Classification Search ........... 438/700–703
See application file for complete search history.

(56) References Cited

U.S. PATENT DOCUMENTS

| | | | |
|---|---|---|---|
| 7,488,685 B2 * | 2/2009 | Kewley ................ | 438/689 |
| 7,560,390 B2 * | 7/2009 | Sant et al. ............ | 438/717 |
| 7,842,601 B2 * | 11/2010 | Lee et al. ............. | 438/622 |
| 7,892,982 B2 * | 2/2011 | Lee et al. ............. | 438/717 |
| 2006/0046484 A1 * | 3/2006 | Abatchev et al. ..... | 438/689 |
| 2007/0123037 A1 * | 5/2007 | Lee et al. ............. | 438/636 |
| 2009/0246966 A1 * | 10/2009 | Cho et al. ............ | 438/735 |
| 2010/0096719 A1 | 4/2010 | Lee et al. | |
| 2010/0112817 A1 | 5/2010 | Lee | |
| 2010/0173492 A1 | 7/2010 | Kim et al. | |

* cited by examiner

*Primary Examiner* — Fernando L Toledo
*Assistant Examiner* — Karen Kusumakar
(74) *Attorney, Agent, or Firm* — William Park & Associates Ltd.

(57) ABSTRACT

A method for forming a semiconductor device is disclosed. A method for forming a semiconductor device includes forming a first hard mask layer over a semiconductor substrate including a cell region and a peripheral circuit region, forming a spacer pattern over the first hard mask layer of the cell region, forming a cell-open mask pattern over the peripheral circuit region, forming a first hard mask pattern by etching the first hard mask layer using the spacer pattern of the cell region as an etch mask, forming a second hard mask layer over the first hard mask pattern of the cell region and a first hard mask layer of the peripheral circuit region, forming a cutting mask pattern over the second hard mask layer; and forming an active region in the cell region and a device isolation region in the peripheral circuit region by etching the second hard mask layer, the first hard mask pattern of the cell region, the first hard mask layer of the peripheral circuit region, and the semiconductor substrate using the cutting mask pattern as an etch mask.

21 Claims, 3 Drawing Sheets

METHOD FOR FORMING SEMICONDUCTOR DEVICE

CROSS-REFERENCE TO RELATED APPLICATION

The priority of Korean patent application No. 10-2010-0105352 filed on Oct. 27, 2010, the disclosure of which is hereby incorporated in its entirety by reference, is claimed.

BACKGROUND OF THE INVENTION

Embodiments of the present invention relate to a method for forming a semiconductor device, and more particularly to a method for forming a semiconductor device so as to simplify a fabrication process by changing a mask process.

Recently, most of electronic appliances comprise a semiconductor device. The semiconductor device comprises electronic elements such as a transistor, a resistor and a capacitor. These electronic appliances are designed to perform a partial function of electronic elements, and integrated on a semiconductor substrate. For example, an electronic appliance such as a computer or a digital camera includes a memory chip for storing information and a processing chip for controlling information. The memory chip and the processing chip include electronic elements integrated on a semiconductor substrate.

The semiconductor devices have a need for an increase in an integration degree, in order to satisfy consumer demands for superior performances and low prices. Such an increase in the integration degree of a semiconductor device entails a reduction in a design rule, causing a pattern size of a semiconductor device to decrease. An entire chip area increases as a memory capacity of a semiconductor device increases. However, a greater number of patterns should be formed in a limited cell area in order to achieve a desired memory capacity, and there is a need for formation of a finer pattern having a reduced critical dimension.

However, an exposure device for implementing a fine pattern required for the increasing integration degree of a semiconductor device does not catch up with rapid development of associated technology. Specifically, when forming a photoresist pattern including silicon using a known exposure device which performs an exposure and development process on the photoresist film including silicon, there is a limitation in resolution capability of the exposure device.

An exemplary method for forming such a fine pattern is a Double Patterning Technology (DPT). The DPT may be classified into a Double Expose Etch Technology (DE2T) and a Spacer Patterning Technology (SPT) that uses a spacer. The DE2T exposes and etches a first pattern having a double cycle of a pattern, and exposes and etches a second pattern having the double cycle of the pattern between the first patterns.

Meanwhile, in order to form more memory cells in one wafer, the chip size decrease or the cell structure is changed. For example, a method for changing a plane arrangement of active regions, a method for changing a cell layout, and the like may be used. In order to implement the above-mentioned methods, a known method, that changes a layout format of the active region from a 8F2 layout to a 6F2 layout, may be used. Generally, the 6F2-layout semiconductor device has a length of 3F in a longitudinal direction of a bit line, and has a length of 2F in a longitudinal direction of a word line. In order to implement the 6F2-layout semiconductor device, the active regions are not parallel to each other in a horizontal direction and has an oblique structure in which a long axis of the active regions is obliquely arranged.

However, the developing speed of a fabrication technology for forming a pattern, including the lithography technology, is slower than the increasing speed of the integration degree of the semiconductor device. Therefore, in case of forming of the oblique-shaped active region, a spacer patterning technology (SPT) method is being used, and in order to separate interconnected patterns from each other, a method for removing some parts of the active region that has been extended in the diagonal direction using the cutting mask may be used.

BRIEF SUMMARY OF THE INVENTION

Embodiments of the present invention are directed to a method for forming a semiconductor device so as to simplify a fabrication process by changing a mask process.

According to the embodiments of the present invention, in a process for forming the active region of the 6F2-structured cell region, uniformity of the active region and the device isolation region increase, such that that characteristics of the semiconductor device increase and a fabrication time/costs decrease, resulting in an increase in productivity of the semiconductor device.

In accordance with an aspect of the present invention, a method for forming a semiconductor device includes forming a first hard mask layer over a semiconductor substrate including a cell region and a peripheral circuit region, forming a spacer pattern over the first hard mask layer of the cell region, forming a cell-open mask pattern over the peripheral circuit region, forming a first hard mask pattern by etching the first hard mask layer using the spacer pattern of the cell region as an etch mask, forming a second hard mask layer over the first hard mask pattern of the cell region and a first hard mask layer of the peripheral circuit region, forming a cutting mask pattern over the second hard mask layer, and forming an active region in the cell region and a device isolation region in the peripheral circuit region by etching the second hard mask layer, the first hard mask pattern of the cell region, the first hard mask layer of the peripheral circuit region, and the semiconductor substrate using the cutting mask pattern as an etch mask, thereby forming an active region in the cell region and forming a device isolation region in the peripheral circuit region.

The first hard mask layer may include polysilicon.

The method may further include: forming a third hard mask layer over the semiconductor substrate; and forming a fourth hard mask layer over the third hard mask layer.

The fourth hard mask layer may include a silicon nitride film.

The forming of the spacer pattern may include: forming a partition pattern over the first hard mask layer; forming a spacer insulation film over the partition pattern; performing an etch-back process of the spacer insulation film; and removing the partition pattern.

The spacer insulation film may include a Ultra Low Temperature Oxide (ULTO) film.

The partition pattern may include a line-and-space pattern.

The forming of the cell-open mask pattern may include depositing a photoresist film over the first hard mask layer including the spacer pattern; and forming a photoresist film pattern by performing an exposure and development process on the photoresist film using an exposure mask opening the cell region.

The forming of the first hard mask pattern may include etching the first hard mask layer using an etch selection ratio between the first hard mask layer and the fourth hard mask layer.

The method may further include removing the cell-open mask pattern.

The method may further include removing the spacer pattern.

The second hard mask layer may include a Spin On Carbon (SOC).

The method may further include forming a reflection prevention film.

The forming of the cutting mask pattern may include: depositing a photoresist film over the second hard mask layer; and forming a photoresist film pattern by performing an exposure and development process using an exposure mask.

The exposure mask may include an island-type transmissive region in the cell region.

The exposure mask may include an island-type or line-type transmissive region in the peripheral circuit region.

The cutting mask pattern may define a mask pattern that defines an active region by cutting the first hard mask pattern.

The first hard mask pattern may be cut using an etch selection ratio between the first hard mask pattern and the fourth hard mask pattern.

The operations from the forming of the cutting mask pattern to the forming of the device isolation region in the peripheral circuit region and the active region in the cell region may be performed by an in-situ.

The forming of the active region in the cell region and the forming of the device isolation region in the peripheral circuit region may include: forming a second hard mask pattern by etching the second hard mask layer using the cutting mask pattern as an etch mask; removing the first hard mask pattern of the cell region exposed by the second hard mask pattern and the first hard mask layer of the peripheral circuit region; and removing the second hard mask pattern.

The removing of the second hard mask pattern may be performed using an etch selection ratio between the first hard mask pattern and the fourth hard mask pattern.

It is to be understood that both the foregoing general description and the following detailed description of the present invention are exemplary and explanatory and are intended to provide further explanation of the invention as claimed.

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts. A semiconductor device and a method for forming the same according to the embodiments of the present invention will hereinafter be described with reference to the accompanying drawings.

FIGS. 1A to 1F are plan views and cross-sectional views illustrating a method for forming a semiconductor device according to an exemplary embodiment of the present invention.

Figure 1A:
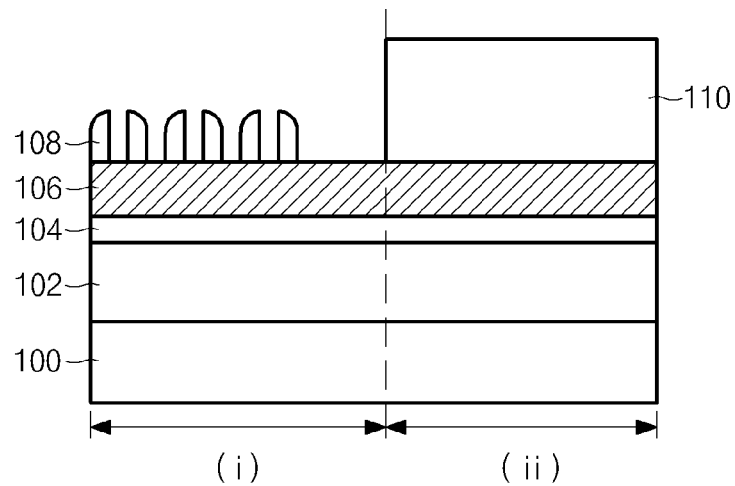
FIGS. 1A to 1F are plan views and cross-sectional views illustrating a method for forming a semiconductor device according to an exemplary embodiment of the present invention.

Referring to FIG. 1A, a semiconductor substrate 100 includes a cell region (i) and a peripheral circuit region (ii). A fourth hard mask layer 104, a third hard mask layer 102, and a first hard mask layer 106 are formed over the semiconductor substrate, and then the spacer pattern 108 is formed. Here, the fourth hard mask layer 104 may include an amorphous carbon layer, the third hard mask layer 102 may include a silicon nitride (SiN) film, and the first hard mask layer 106 may include polysilicon.

In this case, a method for forming the spacer pattern 108 may include forming a line-and-space type partition pattern (not shown), forming a spacer insulation film (not shown) over the line-and-space type partition pattern, performing an etch-back process of the spacer insulation film, and etching the partition pattern (not shown), such that the spacer pattern 108 is formed. Here, the spacer insulation film (not shown) may include a Ultra Low Temperature Oxide (ULTO) layer. Subsequently, a cell-open mask pattern 110 is formed over the peripheral circuit region (ii). In this case, the cell-open mask pattern 110 may include a photoresist film pattern that is formed by an exposure and development process using a mask for opening the cell region (i).

Figure 1B:
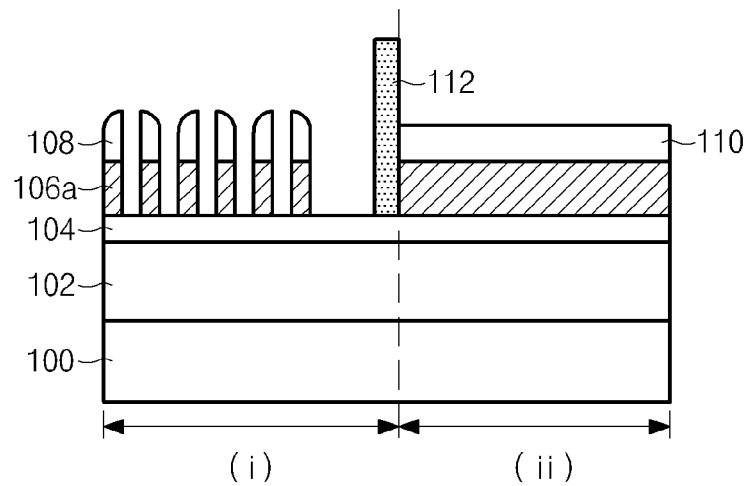

Referring to FIG. 1B, the first hard mask layer 106 is etched using the cell-open mask pattern 110 and the spacer patter 108 as a mask, so that a first hard mask pattern 106a is formed in the cell region (i). Here, the first hard mask pattern 106a may be formed using an etch selection ratio between the first hard mask layer 106 and a fourth hard mask layer 104. In this case, the etch selection ratio between the first hard mask layer 106 and the fourth hard mask layer 104 is the ratio of 100:1 or higher. During the above-mentioned operation, a polymer barrier layer 112 is formed at sidewalls of the cell-open mask pattern 110.

Figure 1C:
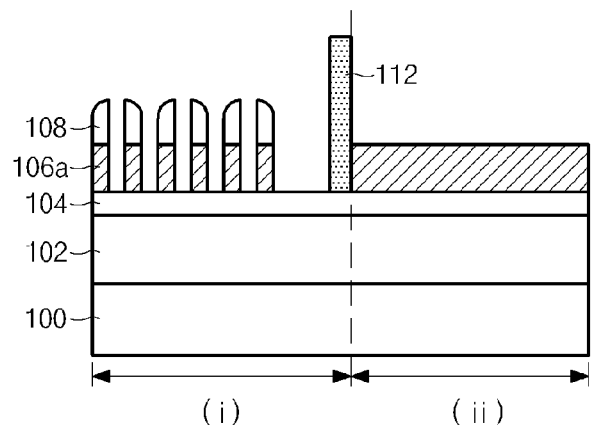

Referring to FIG. 1C, a stripping process for etching the cell-open mask pattern 110 is performed. During the stripping process, the polymer barrier layer 112 remains unetched.

Figure 1D:
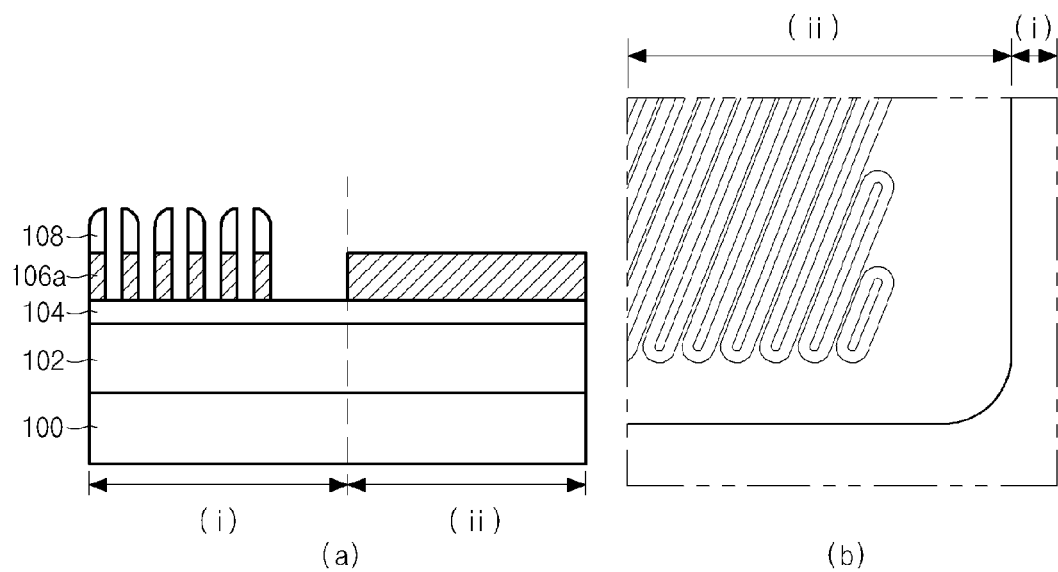

Referring to FIG. 1D, the polymer barrier layer 112 is removed by the cleaning process. In FIG. 1D, (b) is a plan-view image in which the polymer barrier layer 112 is removed, and the spacer patterns 108 arranged in a diagonal direction are formed in the cell region (i). Subsequently, the spacer pattern 108 may be removed.

Figure 1E:
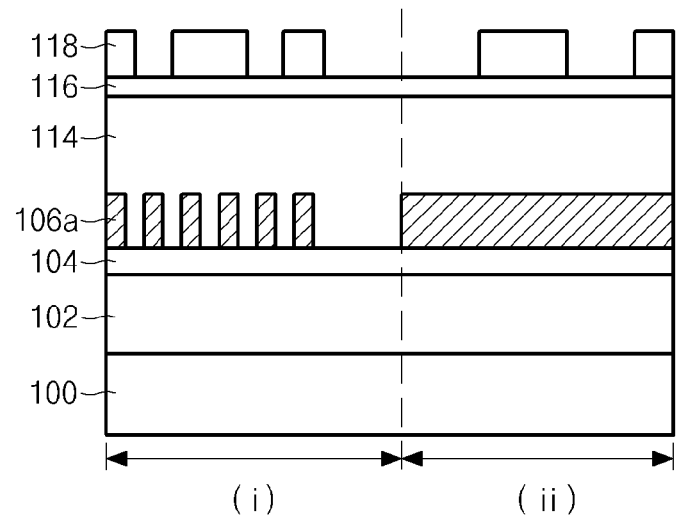

Referring to FIG. 1E, a second hard mask layer 114, a reflection prevention film 116, and a cutting mask pattern 118 are formed over the first hard mask pattern 106a of the cell region (i) and the first hard mask layer 106 of the peripheral circuit region (ii). Here, the second hard mask layer 114 may include a Spin On Carbon (SOC), and the cutting mask pattern 118 may include a photoresist film pattern formed by performing an exposure and development process using an exposure mask. The cell region (i) of the exposure mask may include an island-type transmissive region, and the peripheral circuit region (ii) may include an island-type or line-type transmissive region. The cutting mask pattern 118 may define a mask pattern for defining an active region 122 (See FIG. 1F) by cutting the first hard mask layer pattern 106a diagonally arranged to the cell region (i), and may define a mask pattern for defining a device isolation region 120 (See FIG. 1F) of the peripheral circuit region (ii).

Figure 1F:
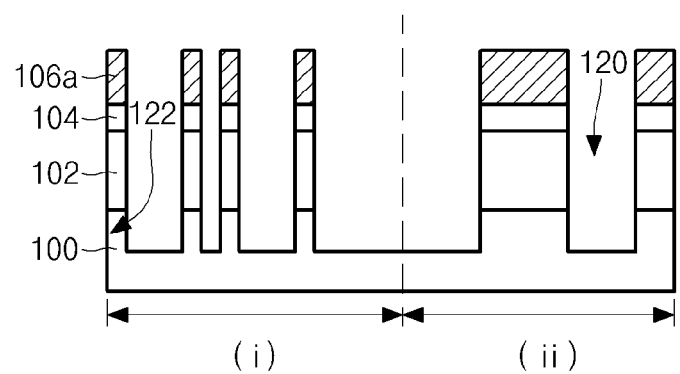

Referring to FIG. 1F, the reflection prevention film 116 and the second hard mask layer 114 are etched using the cutting mask pattern 118 as an etch mask, so that the second hard mask layer pattern (not shown) is formed. Then, the first hard mask pattern 106a of the cell region (i) exposed by the second hard mask pattern (not shown) and the first hard mask layer 106 of the peripheral circuit region (ii) are etched. In this case, the process for etching the first hard mask pattern 106a exposed by the second hard mask pattern (not shown) may be performed using an etch selection ratio between the first hard mask pattern 106a and the fourth hard mask layer 104.

Subsequently, the cutting mask pattern 118 (See FIG. 1E) is etched, and the second hard mask pattern (not shown) is etched. In this case, the process for etching the second hard mask pattern (not shown) may be performed using the etch selection ratio between the first hard mask pattern 106a and the fourth hard mask layer 104.

Subsequently, prior to the etching the second hard mask pattern (not shown), the fourth hard mask layer 104, the third hard mask layer 102, and the semiconductor substrate 100 may be etched using not only the first hard mask pattern 106a of the cell region (i) located under the second hard mask pattern (not shown) but also the first hard mask layer 106 of the peripheral circuit region (ii) as an etch mask, so that the active region 122 and the device isolation region 120 is formed.

Meanwhile, the forming of the cutting mask pattern 118, and the forming of the active region 122 and the device isolation region 120, may be performed in the same chamber. That is, forming of the cutting mask pattern 118, and etching of the lower second hard mask layer 114, the first hard mask pattern 106a, the fourth hard mask layer 104, the third hard mask layer 102 and the semiconductor layer to form the active region 122 and the device isolation region 120 may be performed by an in-situ process.

As apparent from the above description, a method for forming a semiconductor device according to the exemplary embodiment of the present invention has the following effects.

Since the entire process, from a process for forming the cutting mask pattern 118 to the a process for forming the active region 122 and the device isolation region 120 using the cutting mask pattern 118 as an etch mask, is performed in situ, a time consumed for the wafer that enters a chamber and then exits the chamber whenever a process is changed to another process can be reduced, resulting in a reduction in production costs. In addition, since uniformity in width of the active region and the device isolation region increases due to the in-situ process, the characteristics of the semiconductor device may be improved.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for forming a semiconductor device comprising:
    forming a first hard mask layer over a semiconductor substrate including a cell region and a peripheral circuit region;
    forming a spacer pattern over the first hard mask layer of the cell region;
    forming a cell-open mask pattern over the peripheral circuit region;
    forming a first hard mask pattern by etching the first hard mask layer using the spacer pattern of the cell region as an etch mask;
    forming a second hard mask layer over the first hard mask pattern of the cell region and a first hard mask layer of the peripheral circuit region;
    forming a cutting mask pattern over the second hard mask layer; and
    forming an active region in the cell region and a device isolation region in the peripheral circuit region by etching the second hard mask layer, the first hard mask pattern of the cell region, the first hard mask layer of the peripheral circuit region, and the semiconductor substrate, using the cutting mask pattern as an etch mask.

2. The method according to claim 1, wherein the first hard mask layer includes polysilicon.

3. The method according to claim 1, further comprising:
    forming a third hard mask layer over the semiconductor substrate; and
    forming a fourth hard mask layer over the third hard mask layer.

4. The method according to claim 3, wherein the fourth hard mask layer includes a silicon nitride film.

5. The method according to claim 1, wherein the forming of the spacer pattern includes:
    forming a partition pattern over the first hard mask layer;
    forming a spacer insulation film over the partition pattern;
    performing an etch-back process of the spacer insulation film; and
    removing the partition pattern.

6. The method according to claim 5, wherein the spacer insulation film includes an Ultra Low Temperature Oxide (ULTO) film.

7. The method according to claim 5, wherein the partition pattern includes a line-and-space pattern.

8. The method according to claim 1, wherein the forming of the cell-open mask pattern includes:
    depositing a photoresist film over the first hard mask layer including the spacer pattern; and
    forming a photoresist film pattern by performing an exposure and development process on the photoresist film using an exposure mask opening the cell region.

9. The method according to claim 3, wherein the forming of the first hard mask pattern includes etching the first hard mask layer using an etch selection ratio between the first hard mask layer and the fourth hard mask layer.

10. The method according to claim 1, further comprising:
    removing the cell-open mask pattern.

11. The method according to claim 1, further comprising:
    removing the spacer pattern.

12. The method according to claim 1, wherein the second hard mask layer includes a Spin On Carbon (SOC).

13. The method according to claim 1, further comprising:
    forming a reflection prevention film over the second hard mask layer.

14. The method according to claim 1, wherein the forming of the cutting mask pattern includes:
    depositing a photoresist film over the second hard mask layer; and
    forming a photoresist film pattern by performing an exposure and development process using an exposure mask.

15. The method according to claim 14, wherein the exposure mask includes an island-type transmissive region in the cell region.

16. The method according to claim 14, wherein the exposure mask includes an island-type or line-type transmissive region in the peripheral circuit region.

17. The method according to claim 1, wherein the cutting mask pattern defines an active region by cutting the first hard mask pattern.

18. The method according to claim 17, wherein the first hard mask pattern is cut using an etch selection ratio between the first hard mask pattern and the fourth hard mask pattern.

19. The method according to claim 1, wherein the operations, from the forming of the cutting mask pattern to the forming of the device isolation region in the peripheral circuit region and the active region in the cell region, are performed by an in-situ.

20. The method according to claim 1, wherein the forming of the active region in the cell region and the forming of the device isolation region in the peripheral circuit region includes:

forming a second hard mask pattern by etching the second hard mask layer using the cutting mask pattern as an etch mask;

removing the first hard mask pattern of the cell region exposed by the second hard mask pattern and the first hard mask layer of the peripheral circuit region; and removing the second hard mask pattern.

21. The method according to claim 20, wherein the removing of the second hard mask pattern is performed using an etch selection ratio between the first hard mask pattern and the fourth hard mask pattern.

\* \* \* \* \*